United States Patent
Kobayashi et al.

(10) Patent No.: US 9,974,217 B2
(45) Date of Patent: May 15, 2018

(54) JAM PREVENTION MECHANISM

(71) Applicant: YAMAHA HATSUDOKI KABUSHIKI KAISHA, Shizuoka-ken (JP)

(72) Inventors: Yusetsu Kobayashi, Shizuoka (JP); Hiroshi Akiyoshi, Shizuoka (JP); Toshiyuki Kusunoki, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 206 days.

(21) Appl. No.: 14/095,960

(22) Filed: Dec. 3, 2013

(65) Prior Publication Data

US 2014/0151490 A1 Jun. 5, 2014

(30) Foreign Application Priority Data

Dec. 5, 2012 (JP) .................. 2012-265945

(51) Int. Cl.
*H05K 13/02* (2006.01)
*H05K 13/04* (2006.01)

(52) U.S. Cl.
CPC ........... *H05K 13/02* (2013.01); *H05K 13/021* (2013.01); *H05K 13/0417* (2013.01)

(58) Field of Classification Search
CPC .. H05K 13/0417; H05K 13/021; H05K 13/02; B21C 47/34; B65H 23/16
USPC ...................... 242/566; 226/196.1
See application file for complete search history.

(56) References Cited

U.S. PATENT DOCUMENTS

| 5,299,902 A | * | 4/1994 | Fujiwara ............ H05K 13/021 221/25 |
| 6,513,563 B1 | * | 2/2003 | Ando .................. H05K 13/021 156/538 |
| 2009/0249615 A1 | | 10/2009 | Yonemitsu et al. |

FOREIGN PATENT DOCUMENTS

| CN | 101554101 A | | 10/2009 | |
| JP | 06069684 A | * | 3/1994 | |
| JP | WO 9724912 A1 | * | 7/1997 | .......... H05K 13/021 |
| JP | 10-242686 A | | 9/1998 | |
| JP | 11191695 A | * | 7/1999 | |
| JP | H11-177279 A | | 7/1999 | |
| JP | 2011-071257 A | | 4/2011 | |

OTHER PUBLICATIONS

The extended European search report issued by the European Patent Office dated Oct. 29, 2014, which corresponds to European Patent Application No. 13005622.9-1803 and is related to U.S. Appl. No. 14/095,960.

* cited by examiner

*Primary Examiner* — Jennifer Swinney
(74) *Attorney, Agent, or Firm* — Studebaker & Brackett PC

(57) ABSTRACT

A jam prevention mechanism includes a used tape guide with a guide surface along which a used tape fed out from a tape feeder is guided in a guide direction following a longitudinal direction of the used tape. A pressing member presses, against the guide surface, the used tape guided along the guide surface. A support member removably supports the pressing member.

11 Claims, 10 Drawing Sheets

JAM PREVENTION MECHANISM

CROSS REFERENCE TO RELATED APPLICATIONS

This application claims benefit of priority to Japanese Patent Application No. 2012-265945 filed Dec. 5, 2012, the entire content of which is incorporated herein by reference.

TECHNICAL FIELD

The technical field relates to a jam prevention mechanism that prevents a possible tape jam when, for example, a used tape fed out from a tape feeder is cut.

BACKGROUND

An electronic packaging apparatus is known which includes a tape feeder supplying chip components (electronic components) such as ICs using a tape as a carrier. The electronic packaging apparatus uses a cutter to cut a used tape from which electronic components have been unloaded and then retrieves the tape. During the cutting, when the cut portion of the used tape vibrates, the fed-out used tape may be entangled to block a conveying path, that is, a jam may occur. Thus, an electronic packaging apparatus has been proposed which includes a vibration preventing mechanism for a used tape as disclosed in, for example, Japanese Patent Application Laid-Open No. H10-242686.

The electronic packaging apparatus includes a tape conveying surface along which a tape containing electronic components is guided to an electronic component unloading section and along which the used tape with the electronic components unloaded therefrom are guided obliquely downward and forward from the electronic components unloading section, and a cutter device installed downstream of the tape conveying surface. A tape guide that presses the tape against a tape conveying surface is provided in the vicinity of the cutter device. Thus, when the used tape is cut by the cutter device, the used tape is prevented from vibrating on the tape conveying surface.

However, in the electronic packaging apparatus, any used tapes are equally pressed by a tape guide regardless of the type of the tape. Thus, depending on the type of the tape (used tape) or the like, the tape guide may cause an obstruction. In such a case, the used tape is prevented from being smoothly conveyed.

SUMMARY

An object of the present disclosure is to provide a jam prevention mechanism which can prevent a possible jam with used tape fed out from a tape feeder and which can avoid a disadvantageous situation in which the used tape is prevented from being smoothly conveyed depending on the type of the tape used or the like.

An aspect of the present disclosure provides a jam prevention mechanism for a used tape fed out from a tape feeder, the mechanism including a used tape guide with a guide surface along which the used tape is guided in a guide direction following a longitudinal direction of the used tape, a pressing member that presses, against the guide surface, the used tape guided along the guide surface, and a support member that removably supports the pressing member.

BRIEF DESCRIPTION OF THE DRAWINGS

FIG. 7 shows a pressing member, wherein FIG. 7A is a front view, FIG. 7B is a side view, FIG. 7C is a rear view, and FIG. 7D is a bottom view.

DETAILED DESCRIPTION

Figure 1:
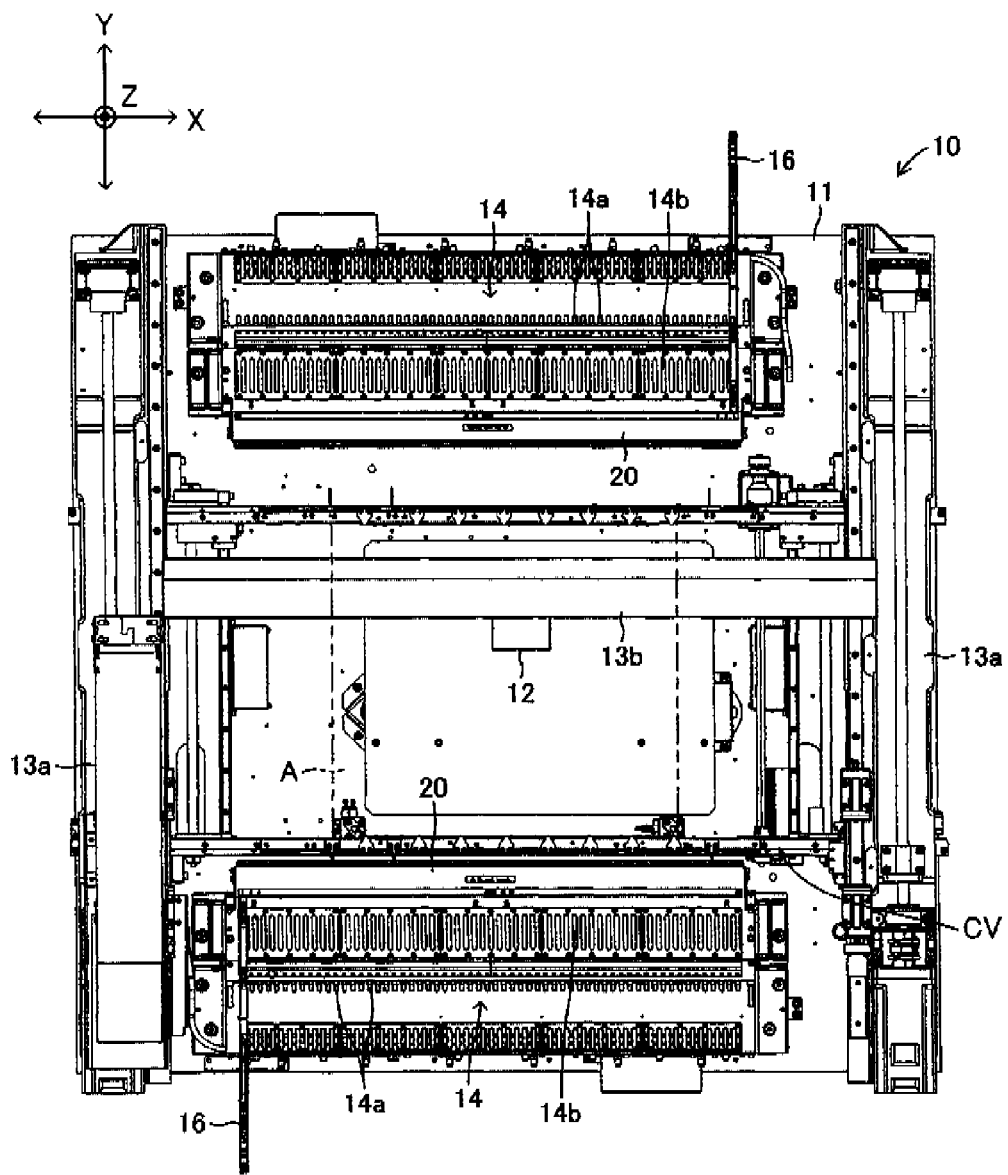
FIG. 1 is a plan view of an electronic packaging apparatus including a jam prevention mechanism according to an embodiment of the present disclosure.

An embodiment of the present disclosure will be described below with reference to the drawings. FIG. 1 is an electronic packaging apparatus 10 including a jam prevention mechanism according to the embodiment.

The electronic packaging apparatus 10 mounts an electronic component B such as an IC chip (see FIG. 2) on a printed circuit substrate A such as a printed wiring board. The electronic packaging apparatus 10 has a base 11. The base 11 includes a conveyor CV installed thereon to convey the substrate A in an X direction (the lateral direction of FIG. 1). The printed circuit board A is placed onto the conveyor CV from the right side of FIG. 1 and conveyed to a predetermined operating position (which is shown in FIG. 1). At the operating position, a packaging process is carried out on the printed circuit board A, which is then conveyed to the left side of FIG. 1.

The base 11 includes a head unit 12 moving above the printed circuit board A in the X direction and in a Y direction (the front-rear direction of FIG. 1).

Specifically, the base 11 includes a pair of Y rail units 13a installed thereon with a specific distance between the rail units in the X direction and each extending in the Y direction. The pair of Y rail units 13a supports an X rail unit 13b extending in the X direction so that the X rail unit 13b is movable in the Y direction. A head unit 12 is attached to the X rail unit 13b so as to be movable in the X direction. Thus, the head unit 12 can move above the base 11 within the range in which the X rail unit 13b is movable.

The head unit 12 includes a plurality of heads (not shown in the drawings) with suction nozzles. The plurality of heads is shaped like a shaft extending in a Z direction (up-down direction; a direction orthogonal to the sheet of FIG. 1). The plurality of heads is individually elevated and lowered by actuating an elevating and lowering device and is individually rotated around an axis by actuating a rotating device. The suction nozzle is installed at a lower end of the head and sucks and picks up the electronic component B by a suction force generated by actuating a suction device.

The base 11 includes feeder installation sections 14 at respective opposite ends thereof in the Y direction. Each of the feeder installation sections 14 includes tape feeders 16 installed thereon to supply the electronic component B using a tape 15 described below as a carrier. In the feeder installation section 14 in the front of the apparatus (the front of the electronic packaging apparatus 10; the lower side of FIG. 1), a plurality of the tape feeders 16 is removably installed so as to lie in parallel in the same direction. Similarly, in the feeder installation section 14 in the rear of the apparatus (the upper side of FIG. 1), a plurality of the tape feeders 16 is removably installed so as to lie in parallel in the same direction. In an example shown in FIG. 1, only one tape feeder 16 is illustrated in the feeder installation section 14.

For each of the tape feeders 16, the side of a position at which the electronic component B is unloaded from the tape feeder 16 (the position of an opening 17b described below) is located closer to the printed circuit board A side (conveyor CV side). The tape feeder 16 pays a tape 15 out toward the printed circuit board A side to convey the electronic component B accommodated in the tape 15 to the unload position.

Figure 2:
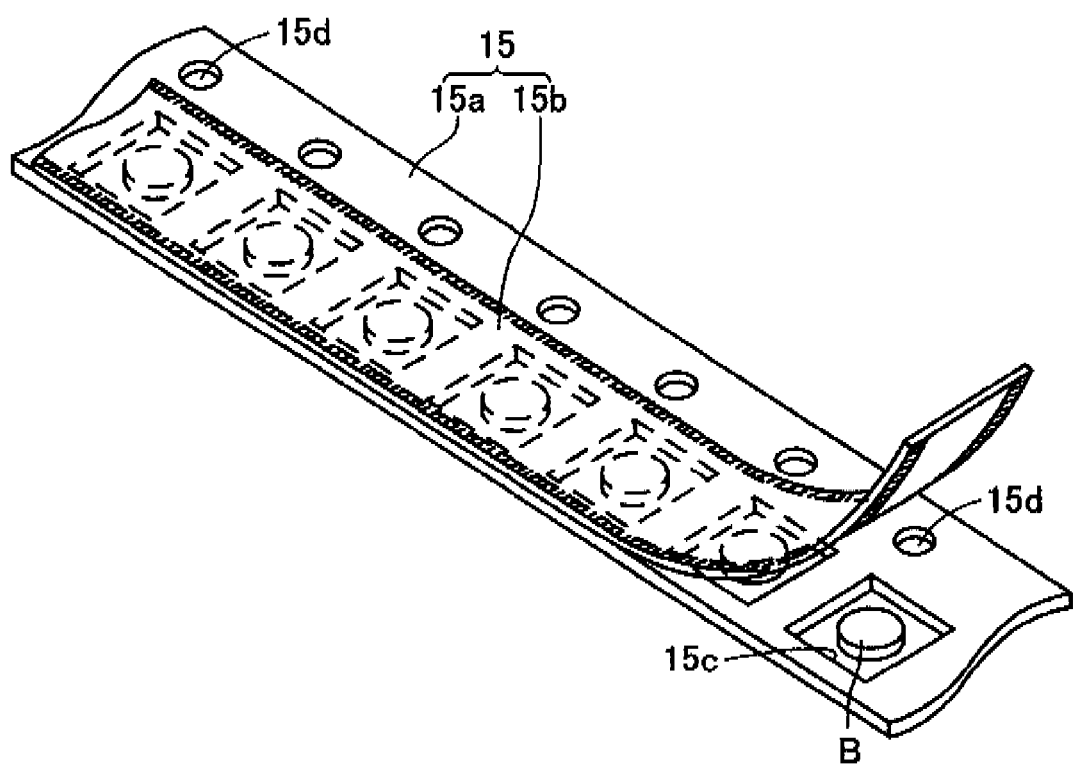
FIG. 2 is a perspective view showing a tape.

As shown in FIG. 2, the tape 15 includes a carrier tape 15a and a cover tape 15b that is smaller than the carrier tape 15a in width. The carrier tape 15a includes a plurality of accommodation sections 15c formed at regular intervals in a longitudinal direction of the tape and a plurality of engagement holes 15d formed at regular intervals in the longitudinal direction. The electronic component B is accommodated in each of the accommodation sections 15c. The tape 15 is formed by sticking the cover tape 15b to the carrier tape 15a so that the cover tape 15b can cover the accommodation sections 15c. That is, each of the electronic components B can be unloaded by peeling the cover tape 15b off from the carrier tape 15a. The tape 15 is wound around a reel before the tape 15 is installed in the tape feeder 16.

Figure 3:
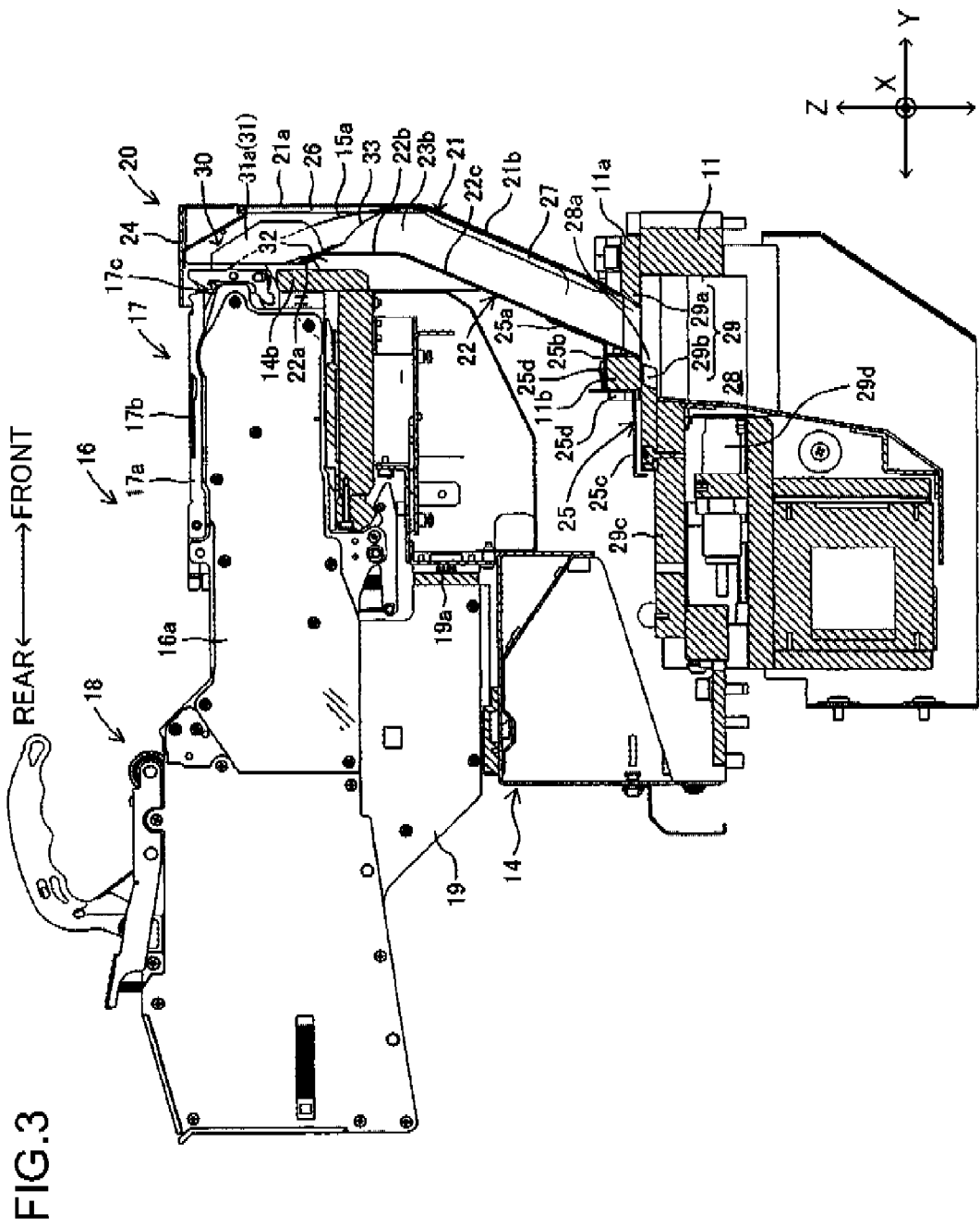
FIG. 3 is a cross-sectional view showing a tape feeder and a jam prevention mechanism.
Figure 4:
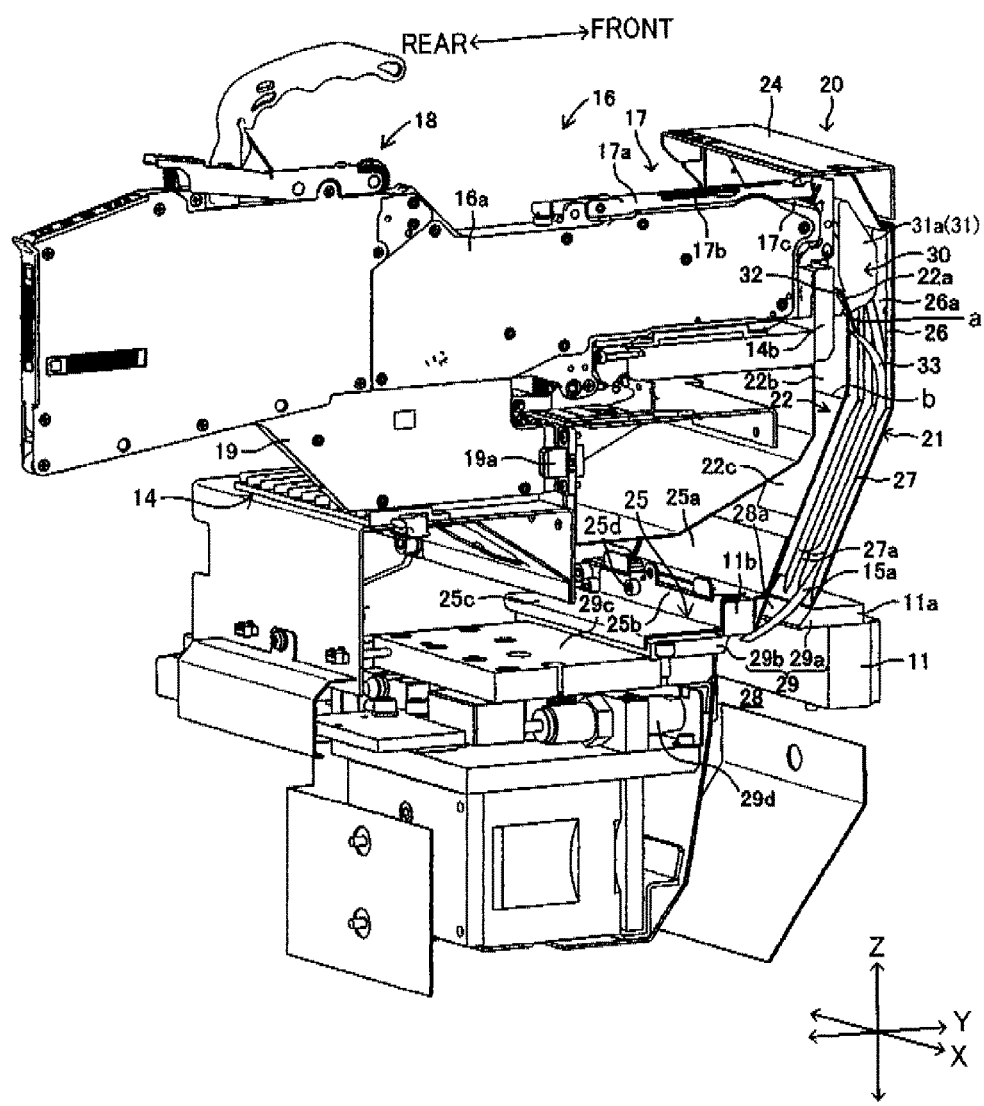
FIG. 4 is a perspective view showing the tape feeder and jam prevention mechanism shown in FIG. 3.

Now, with reference to FIG. 3 and FIG. 4, the tape feeder 16 will be described in detail. In the description of the tape feeder 16 and a used tape guide 20 described below or the like, the printed circuit board A (conveyor CV) side (the right side of FIG. 3 and FIG. 4) is defined as a front side and the opposite side is defined as a rear side based on the state in which the tape feeder 16 is installed in the feeder installation section 14, as shown in FIG. 3 and FIG. 4. Furthermore, the X direction is hereinafter referred to as the lateral direction where appropriate.

The tape feeder 16 has a case member 16a which forms an outer fence of the tape feeder 16 and which is elongate in the front-rear direction. The case member 16a includes a conveying path (not shown in the drawings) inside which extends from a rear lower portion of the case member 16a to a front upper portion of the case member 16a in an inclined manner. Furthermore, the case member 16a includes, on a front side thereof, a feeding mechanism (not shown in the drawings) that conveys the tape to the unload position for the electronic component B, and a tape guide section 17. The case member 16a includes a pick-up mechanism 18 provided in a rear upper portion of the case member 16a to pick up the cover tape 15b in a rearward direction, which has been peeled off from the carrier tape 15a, and a cover tape collection section provided in an inner rear portion of the case member 16a and above the conveying path to accommodate the cover tape 15b peeled off from the carrier tape 15a by the pick-up mechanism 18.

The tape guide section 17 has a tape guide 17a mounted in a front upper portion of the case member 16a and on an upper side of the conveying path. The tape guide 17a includes an opening 17b which penetrates the tape guide 17a in the up-down direction and which is elongate in the front-rear direction and through which the electronic component is unloaded. That is, the tape 15 is pulled out from the reel (not shown in the drawings) disposed in the rear side of the case member 16a and guided along the conveying path under the tape guide 17a to the front side of the case member 16a. Then, the cover tape 15b is peeled off from the carrier tape 15a at the position of a rear edge portion of the opening 17b. The peeled-off cover tape 15b is folded back around a rear edge portion of the case member 16a toward an outer side (upper side) of the tape guide 17a and picked up by the pick-up mechanism 18. Thus, the accommodation section 15c of the tape 15 is opened substantially at a central portion of the opening 17b, and the electronic component B can be unloaded through the opening 17b by the suction nozzle. In other words, in this example, the position of the opening 17b corresponds to the unload position for the electronic component B.

The tape guide 17a is formed to press, from above, the tape 15 (including the carrier tape 15a from which the cover tape 15b has been peeled off) being conveyed. This restrains the tape 15 from rising from the conveying path or being tilted.

Furthermore, the tape guide 17a includes a used tape support surface 17c located in front of the unload position on the conveying path from which the electronic component B is unloaded, the tape support surface 17c supporting the empty carrier tape 15a from which the electronic component B has been unloaded. The used tape support surface 17c includes a horizontal surface connected to the conveying path and an inclined surface inclined slightly downward from a front end of the horizontal surface. Thus, the empty carrier tape 15a from which the electronic component B has been unloaded moves along the used tape support surface 17c toward the used tape guide 20 described below.

Each of the feeding mechanism and the pick-up mechanism 18 includes a drive roller, a pinch roller, and a motor that rotationally drives the drive roller. The feeding mechanism pulls the tape 15 out from the reel and feeds the tape 15 out to the unload position for the electronic component B. The pick-up mechanism 18 picks up and feeds the cover tape 15b peeled off from the tape 15 to the cover tape collection section. Furthermore, an accommodation box 19 that accommodates a control circuit board and the like is disposed in a lower central portion of the case member 16a. A connector 19a is attached to a front side of the accommodation box 19. When the tape feeder 16 is mounted on a predetermined place of the feeder installation section 14, the connector 19a is electrically connected to a connector 14a (shown in FIG. 1) provided on the feeder installation section 14. This allows the electronic packaging apparatus 10 to supply power to the tape feeder 16 and to output various control signals to the tape feeder 16. Additionally, the control circuit board accommodated in the accommodation box 19 cooperates with a control section of the electronic packaging apparatus 10 in controlling the tape feeder 16.

The used tape guide 20 is installed on the base 11 between the conveyor CV (the position of the printed circuit board A) and the feeder installation section 14. To retrieve the used carrier tape 15a (the carrier tape 15a from which the electronic component B has been unloaded; hereinafter referred to as the used tape 15a) in a collection box (not shown in the drawings) disposed below the base 11, the used tape guide 20 guides the used tape 15a downward, which has been fed out from the tape feeder 16. A fall-down hole 28 is formed in the base 11 and below the used tape guide 20 so that, after being cut by a cutter 29 described below, the used tape 15a guided by the used tape guide 20 is placed in the collection box through the fall-down hole 28.

In the description below of the used tape guide 20, the side of traveling direction of the tape is referred to as a downstream side, and the opposite side is referred to as an upstream side, based on a direction in which the used tape 15a is conveyed (the direction corresponds to a guide direction according to the present disclosure and is hereinafter referred to as the guide direction when appropriate).

Figure 5:
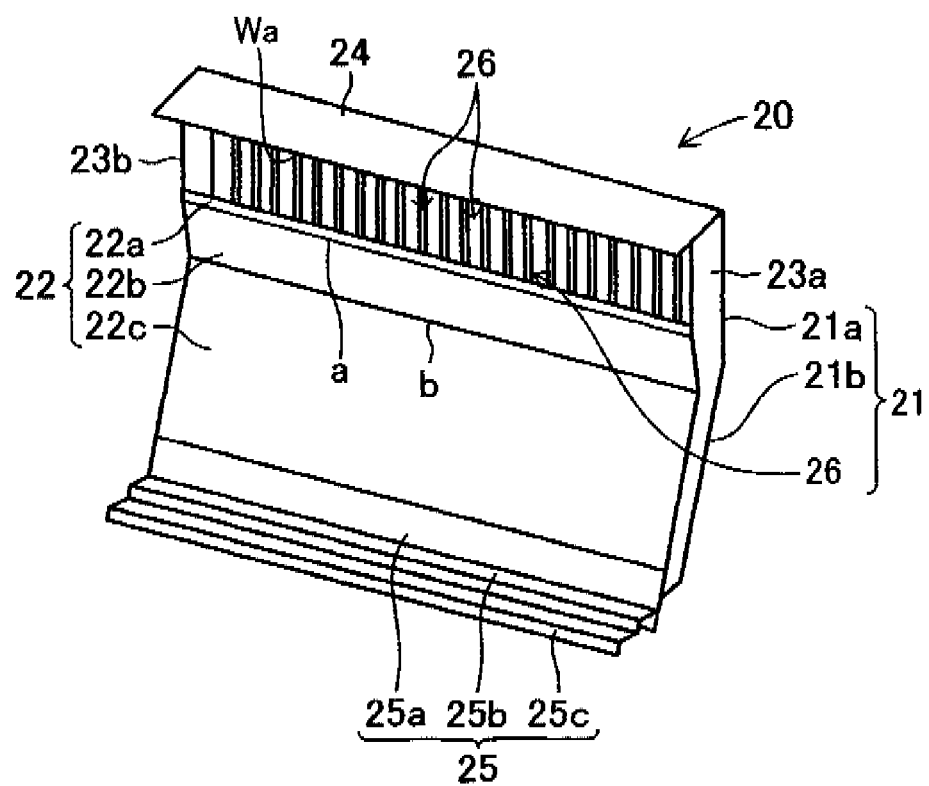
FIG. 5 is a perspective view showing a used tape guide.
Figure 8:
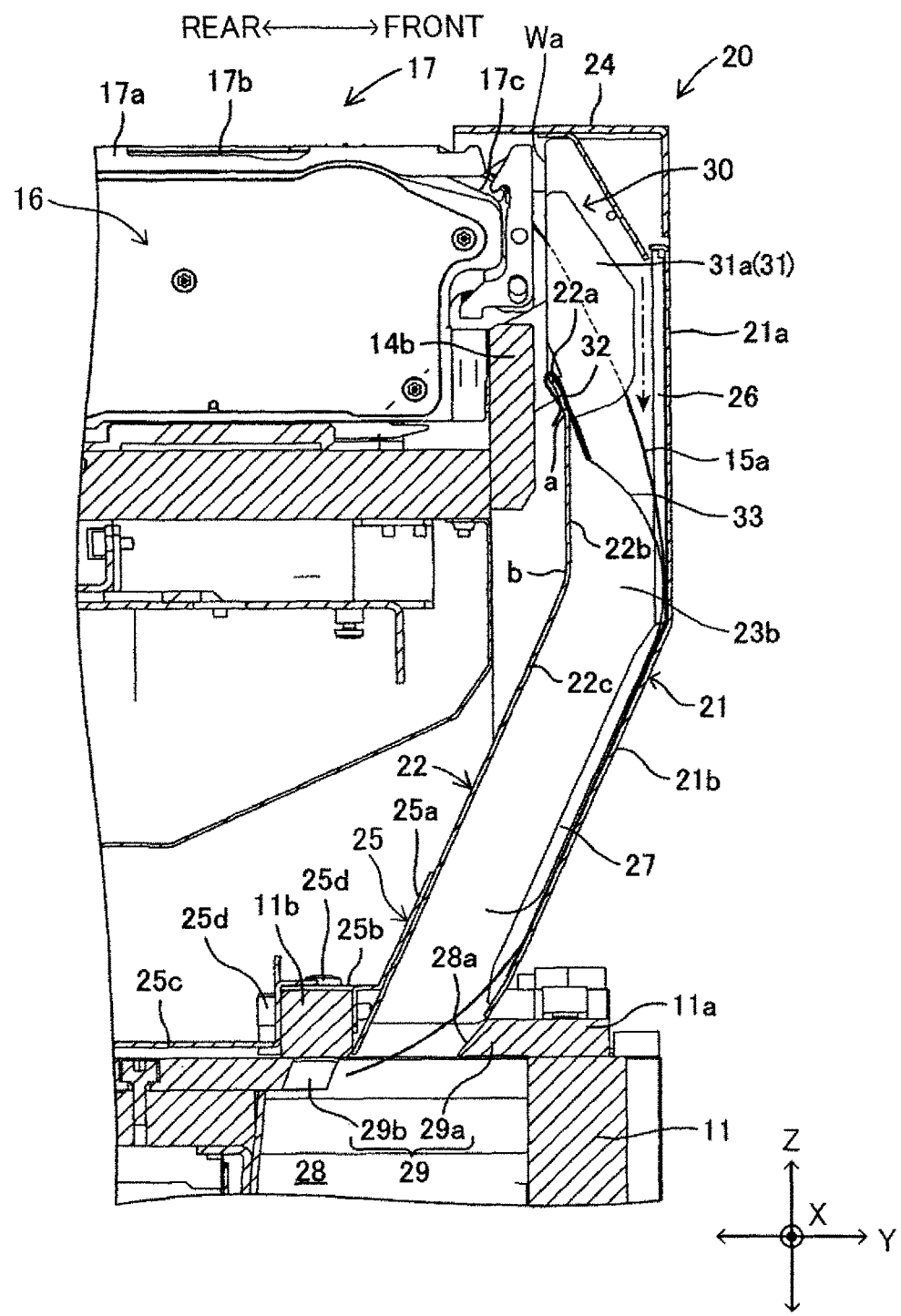
FIG. 8 is a cross-sectional view showing that the pressing member attached to the used tape guide presses the used tape.
Figure 9:
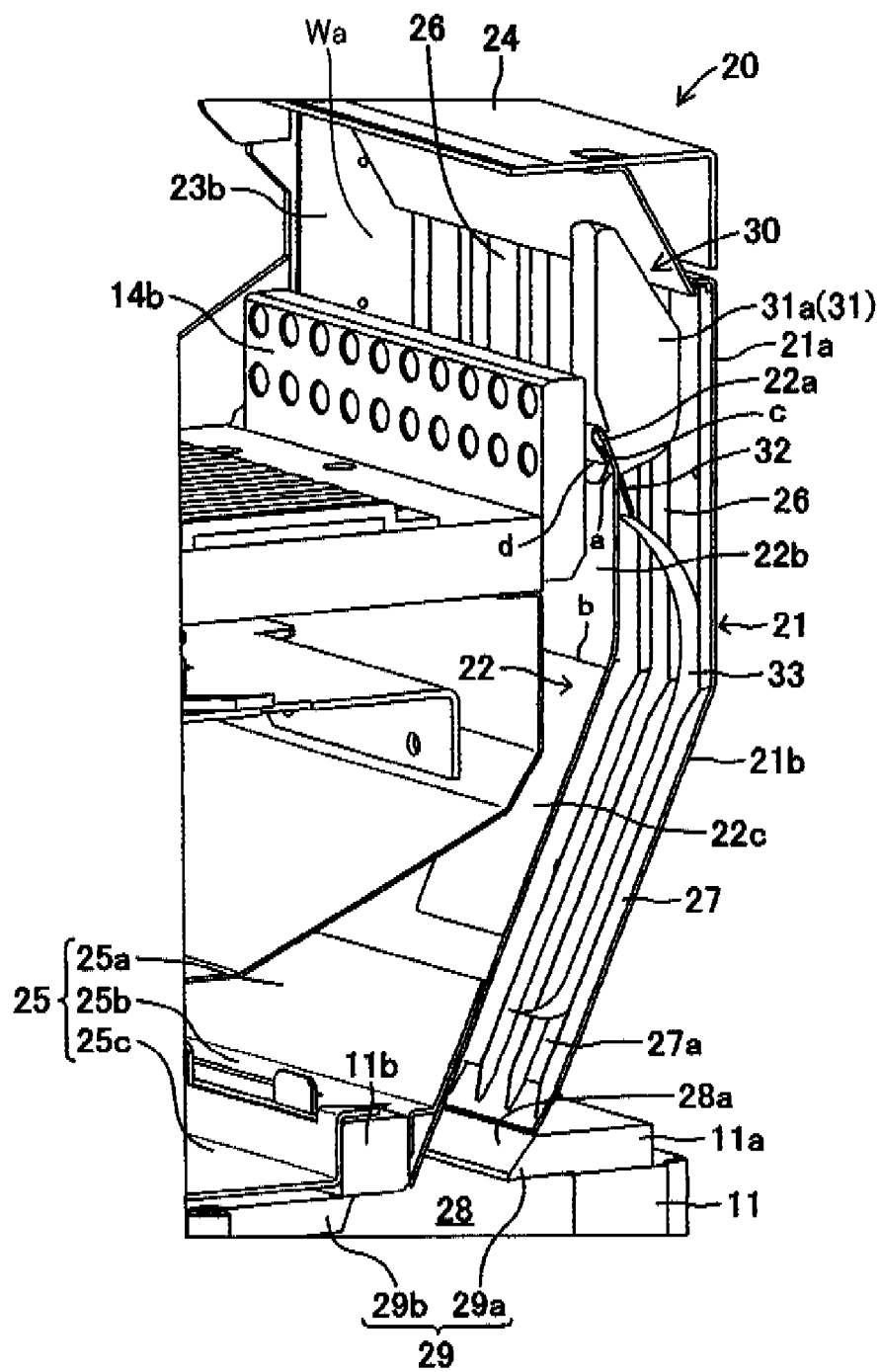
FIG. 9 is a perspective view showing the used tape guide and the pressing member.

As shown in FIG. 5, FIG. 8, and FIG. 9, the used tape guide 20 is positioned in front of the tape feeder 16 and has, a base surface portion 21 with a guide surface on a rear side along which the used tape 15a is guided in the guide direction parallel to the longitudinal direction of the used tape 15a, an auxiliary surface portion 22 having an opposite surface to the guide surface and disposed behind and at a predetermined distance from the base surface portion 21, side surface portions 23a and 23b that connect the base surface portion 21 and the auxiliary surface portion 22 together in the front-rear direction, an upper surface portion 24 attached to upper ends of the base surface portion 21 and the side surface portions 23a and 23b, and a fixed portion 25 attached to a lower end of the auxiliary surface portion 22.

The base surface portion 21 includes, on a rear side thereof, a plurality of guide sections 26 arranged in parallel and extending substantially in the vertical direction and a plurality of guide sections 27 each extending obliquely downward and rearward from a lower end portion of the corresponding guide section 26. Specifically, the base surface portion 21 includes a plate-like base member with an upper side guide attachment section 21a extending substantially in the vertical direction and a lower side guide attachment section 21b extending obliquely downward and rearward from a lower end of the upper side guide attachment section 21a. The upper side guide attachment section 21a includes the plurality of guide sections 26 arranged in parallel. The lower side guide attachment section 21b includes the plurality of guide sections 27 arranged in parallel. The base member is formed of, for example, a quadrangular plate material bent substantially in the center thereof in the up-down direction.

Figure 6:
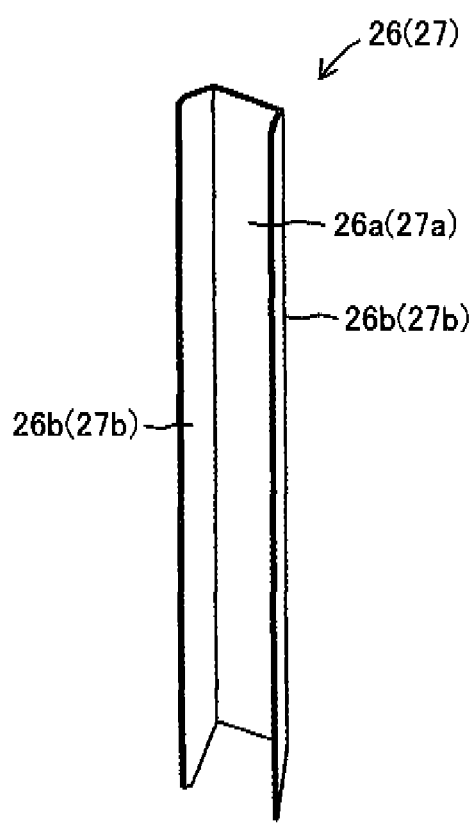
FIG. 6 is a perspective view showing a guide section of the used tape guide.

As shown in FIG. 6, the guide section 26 is a plate-like member formed of a rectangular plate material folded so as to have a substantially U-shaped cross section. The guide section 26 has a guide surface section 26a fixed to the upper side guide attachment section 21a and extending in the up-down direction and a pair of protruding portion formation pieces 26b extending along both a right edge portion and a left edge portion of the guide surface section 26a. The pair of protruding portion formation pieces 26b is formed such that the distance between the protruding portion formation pieces 26b increases consistently with a distance from the guide surface section 26a. The guide section 27 is similarly formed of a plate-like member having a substantially U-shaped cross section, and has a guide surface portion 27a fixed to the lower side guide attachment section 21b and extending in the up-down direction, and a pair of protruding portion formation pieces 27b extending along both a right edge portion and a left edge portion of the guide surface portion 27a.

The upper side guide attachment section 21a includes the plurality of guide sections 26 arranged in parallel, and the lower side guide attachment section 21b includes the guide sections 27 in the same number as the guide sections 26, the guide sections 27 being arranged in parallel so as to be extended downward from the guide sections 26. That is, the guide surface of the base surface portion 21 is formed by the guide surface sections 26a and 27a of the corresponding upper and lower guide sections 26 and 27. The number of the guide sections 26 (27) is the same as the number of the tape feeders 16 that can be mounted on the feeder installation section 14. An array pitch for the guide sections 26 (27) is set the same as an array pitch for the tape feeders 16.

As shown in FIG. 8 and FIG. 9, the auxiliary surface portion 22 has an upper side auxiliary surface portion 22b located opposite the guide sections 26 (upper side guide attachment section 21a) of the base surface portion 21 and extending substantially in the vertical direction, a lower side auxiliary surface portion 22c located opposite the guide sections 27 (lower side guide attachment section 21b) of the base surface portion 21 and extending obliquely downward and rearward from a lower end of the upper side auxiliary surface portion 22b, and a bent edge portion 22a extending rearward and upward from an upper end of the upper side auxiliary surface portion 22b. The upper side auxiliary surface portion 22b is shorter than the upper side guide attachment section 21a in the up-down direction and lies opposite substantially the lower half of the upper side guide attachment section 21a. The auxiliary surface portion 22 is formed of, for example, a quadrangular plate material which is identical to the base member of the base surface portion 21 in width and which is shorter than the base surface portion 21 in the up-down direction, the plate material being bent at two positions (bent portions (a) and (b)).

The bent edge portion 22a includes a small bent portion (c) (see FIG. 10) formed in a middle portion of the bent edge portion 22a in the guide direction so that an upper end of the bent edge portion 22 small bent portion (c) is directed rearward. In this example, the bent edge portion 22a corresponds to an edge portion according to the present disclosure. The bent edge portion 22a is shaped to be elongate in the lateral direction (X direction) and to be sufficiently shorter than the upper side auxiliary surface portion 22b in the up-down direction.

A right end portion and a left end portion (end portions in the X direction) of the auxiliary surface portion 22 are connected to a right end portion and a left end portion, respectively, of the base surface portion 21 by the side surface portions 23a and 23b. Thus, the base surface portion 21, the auxiliary surface portion 22, and the side surface portions 23a and 23b form a passage having a substantially rectangular cross section and which is elongate in the lateral direction and which extends in the up-down direction so as to bend in a middle portion of the passage. The side surface portions 23a and 23b are connected to respective side edge portions of the base surface portion 21 from an upper end to a lower end thereof.

The upper surface portion 24 is formed of a plate-like member and configured to cover the upper end of the base surface portion 21 and upper ends of side surface portions 23a and 23b. A rear end of the upper surface portion 24 extends rearward beyond the bent edge portion 22a of the auxiliary surface portion 22. A gap is formed between the upper surface portion 24 and the bent edge portion 22a so as to enable the used tape 15a fed out from the tape feeder 16 to pass through the used tape guide 20. That is, the used tape guide 20 includes a window portion Wa in an upper portion thereof through which the used tape 15a fed out from the tape feeder 16 is received.

The fixed portion 25 allows the used tape guide 20 to be fixed to the base 11. The fixed portion 25 has a fixation piece 25a fixed to a rear surface of a lower end portion of the auxiliary surface portion 22, an engagement piece 25b connected to a lower end of the fixation piece 25a and having a U-shaped cross section that is open downward, and a reinforcement piece 25c having an L-shaped cross section and which extends rearward and substantially horizontally from a rear end of the engagement piece 25*b* and which is bent downward.

As shown in FIG. 4 and FIG. 8, the base 11 includes a support section 11*a* for the used tape guide 20. The support section 11*a* has a fixation section 11*b* provided at a rear end portion thereof and having a rectangular cross section. The used tape guide 20 is disposed on the support section 11*a* with the fixation section 11*b* interposed inside the engagement piece 25*b* and is fixed to the fixation section 11*b* with a plurality of bolts 25*d*. Specifically, an upper surface and a rear surface of the engagement piece 25*b* are fixed to the fixation section 11*b* with the bolts 25*d*, allowing the used tape guide 20 to be attached to the support section 11*a*.

Since the used tape guide 20 is thus attached to the support section 11*a*, the upper side guide sections 26 (guide surface sections 26*a*) are substantially vertically arranged and each of the lower side guide sections 27 (guide surface portions 27*a*) extends obliquely downward and rearward from the lower end of the upper side guide sections 26 (guide surface sections 26*a*), as described above. Furthermore, the window portion Wa of the used tape guide 20 is positioned in front of the tape feeders 16 attached to the feeder installation section 14.

The used tape guide 20 removably supports a plurality of pressing members 30. The pressing members 30 press the used tape 15*a* guided along the guide surface sections 26*a* and 27*a* of the guide sections 26 and 27, against the guide surface sections 26*a* and 27*a*.

The pressing members 30 are disposed between the base surface portion 21 and the auxiliary surface portion 22 and supported by the auxiliary surface portion 22. As shown in FIG. 7A to FIG. 7D and FIG. 8, the pressing member 30 has a band-like pressing section 33 (corresponding to a main body portion according to the present disclosure) extending in the up-down direction, an insertion and removal section 32 provided at one longitudinal end (upper end) of the pressing section 33, and a guide gripping section 31 provided in a front upper portion of the insertion and removal section 32 (in FIG. 7B, in an upper right portion of the insertion and removal section).

The guide gripping section 31 guides the empty carrier tape 15*a* to the interior of the used tape guide 20 and functions as a gripping section when the pressing member 30 is held by hand. The guide gripping section 31 has a pair of side surface portions 31*a* disposed opposite each other in the lateral direction (X direction; the direction orthogonal to the sheet of FIG. 7B), a rear side connection section 31*c* that connects rear lower portions of the side surface portions 31*a*, and a front side connection section 31*d* that connects front upper portions of the pair of side surface portions 31*a*. The guide gripping section 31 is generally shaped like a pipe penetrating obliquely in the up-down direction.

Figure 7:
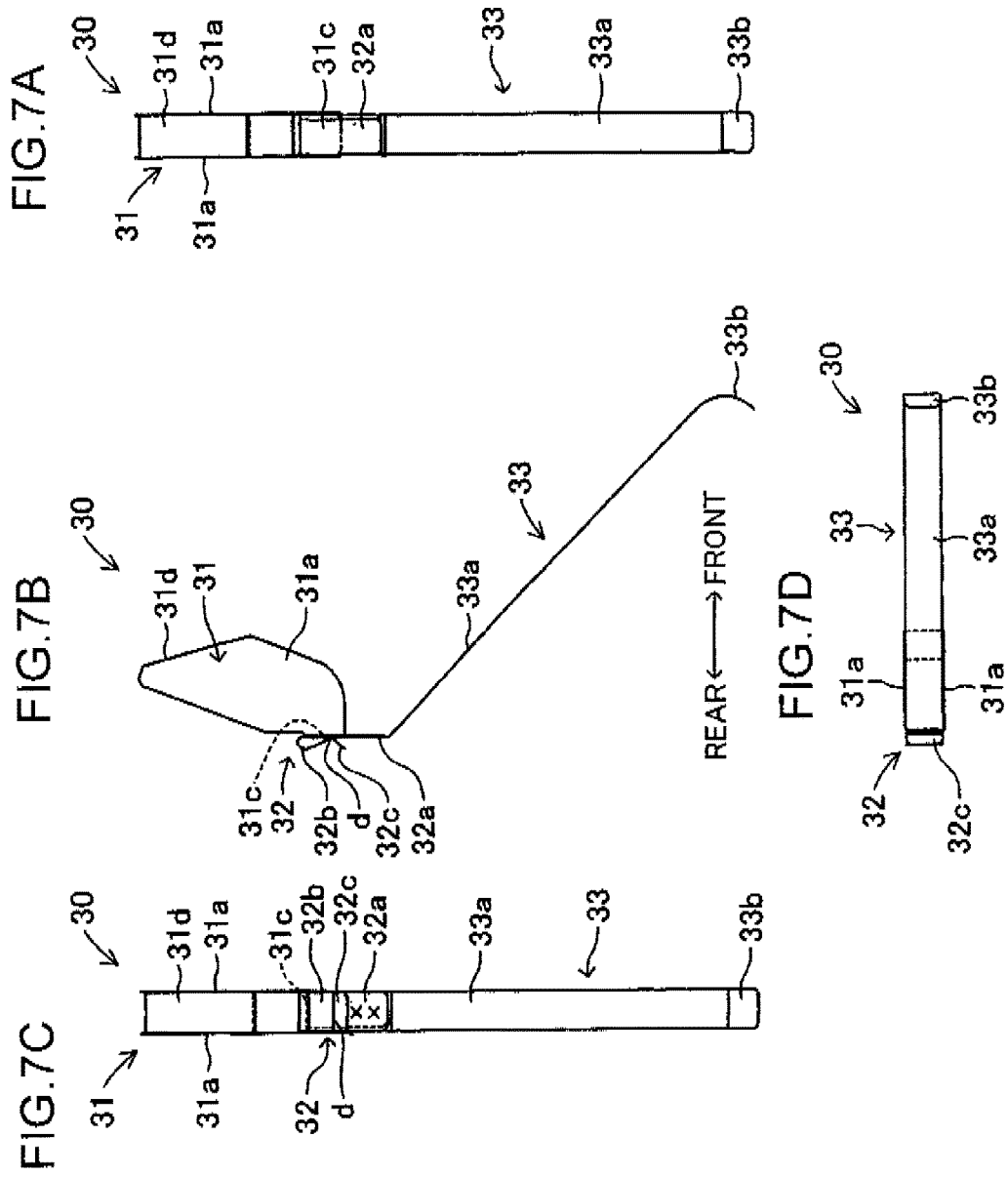

As shown in FIG. 7B, the side surface portion 31*a* has a vertically long and deformed substantially hexagonal contour including a rear lower side extending in the vertical direction from a rear lower end of the side surface portion 31*a*, a rear upper side extending obliquely upward and forward from an upper end of the rear lower side, an upper side extending forward from an upper end of the rear upper side, a front upper side extending obliquely downward and forward from a front end of the upper side, a front lower side extending obliquely downward and rearward from a lower end of the front upper side and substantially parallel to the rear upper side, and a lower side extending rearward from a lower end of the front lower side and connected to a lower end of the rear lower side. In this example, the distance between the opposite side surface portions 31*a* (inner surfaces) is set to 9 mm, and the width between the rear side connection section 31*c* and the front side connection section 31*d* is set to 10 mm. Furthermore, the width of the carrier tape 15*a* is set to 8 mm, and the width of each of the guide surface sections 26*a* and 27*a* is set to 10 mm.

The insertion and removal section 32 and the pressing section 33 are integrally formed by bending a band-like plate spring. Specifically, the insertion and removal section 32 is formed of a fold-back portion obtained by folding back one longitudinal end of the band-like plate spring. The pressing section 33 is formed of the remaining portion of the plate spring.

The insertion and removal section 32 includes a fixed portion 32*a* fixed to the rear side connection section 31*c* of the guide gripping section 31, an elastic bent portion 32*b* turning around from an upper end of the fixed portion 32*a* in a semi-circle form and extending straight toward the vicinity of the center of the fixed portion 32*a*, and a short piece-like insertion guide section 32*c* extending rearward and downward from a leading end (lower end) of the elastic bent portion 32*b*. That is, the insertion and removal section 32 has a substantially U-shaped cross section. The fixed portion 32*a* is fixed to the rear side connection section 31*c* by welding (spot welding or the like). A boundary portion (d) between the elastic bent portion 32*b* and the insertion guide section 32*c* is compressed against the fixed portion 32*a* by the elastic force of the elastic bent portion 32*b*.

The pressing section 33 includes a swing section 33*a* extending obliquely downward and forward and straight from a lower end of the fixed portion 32*a* and which is elastically displaceable (can be swung) in the front-rear direction, and a bent portion 33*b* turning around gently from a lower end of the swing section 33*a* and extending downward. In this example, the width of the swing section 33*a* is set to 9 mm.

As shown in FIG. 8 and FIG. 9, the pressing members 30 are disposed between the base surface portion 21 and auxiliary surface portion 22 of the used tape guide 20. The pressing member 30 is supported by the used tape guide 20 (auxiliary surface portion 22) by installing the insertion and removal section 32 at the upper end (bent edge portion 22*a*) of the auxiliary surface portion 22. In this example, the used tape guide 20, the pressing members 30, the cutter 29 described below, and the like form a jam prevention mechanism according to the present disclosure.

The pressing members 30 are attached to the used tape guide 20 as described below.

First, the guide gripping section 31 of the pressing member 30 is held by hand, and the pressing section 33 is inserted into the used tape guide 20 through the window portion Wa. Then, while the bent edge portion 22*a* of the auxiliary surface portion 22 is being positioned between the fixed portion 32*a* and insertion guide section 32*c* of the insertion and removal section 32, the pressing member 30 is pressed from above the auxiliary surface portion 22 (from the upstream side in the guide direction). When the pressing member 30 is pressed as described above, the bent edge portion 22*a* is inserted between the fixed portion 32*a* and the elastic bent portion 32*b* to elastically displace the elastic bent portion 32*b* rearward. The resilient force of the elastic bent portion 32*b* causes the bent edge portion 22*a* to be pinched by the insertion and removal section 32. When the insertion and removal section 32 is installed on the bent edge portion 22*a* as described above, the attachment of the pressing member 30 to the used tape guide 20 is completed.

Figure 10:
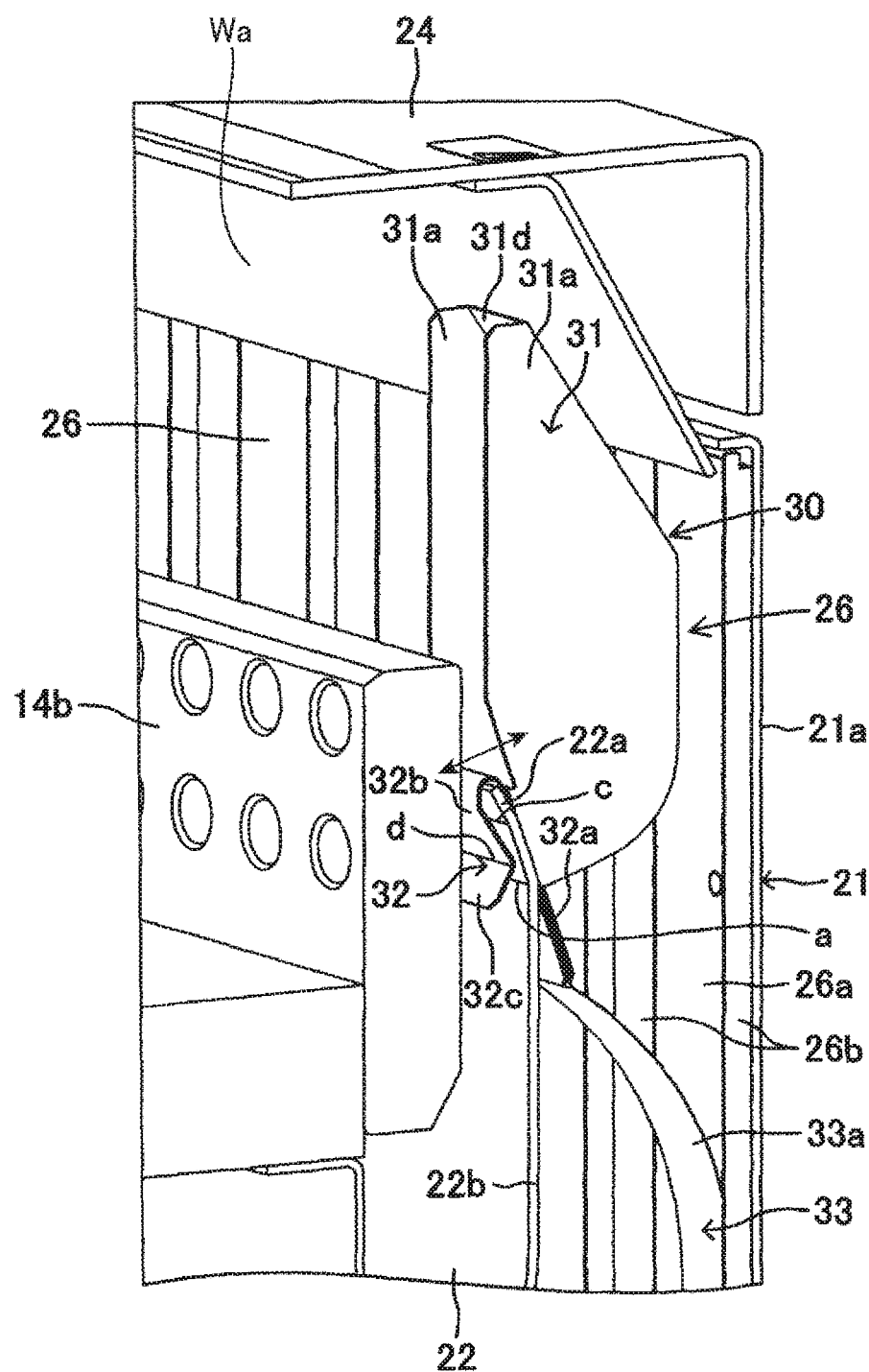
FIG. 10 is a perspective view showing an important part of the jam prevention mechanism.

With the insertion and removal section 32 installed on the bent edge portion 22a, the boundary portion (d) between the elastic bent portion 32b and the insertion guide section 32c is compressed against (engaged with) the vicinity of the bent portion (a) of the auxiliary surface portion 22 (a position slightly above a boundary portion between the bent edge portion 22a and the upper side auxiliary surface portion 22b). This prevents the pressing member 30 from being unintentionally slipped upward off from the used tape guide 20. That is, as shown in FIG. 10, an upper end portion of the bent edge portion 22a is inclined rearward. Thus, when the pressing member 30 acts to move upward, the boundary portion (d) of the insertion and removal section 32 is compressed hard against the bent edge portion 22a, suppressing upward displacement of the pressing member 30. Furthermore, even if the insertion and removal section 32 moves upward with respect to the bent edge portion 22a, the boundary portion (d) of the insertion and removal section 32 engages with the bent portion (c) of the bent edge portion 22a, preventing the insertion and removal section 32 from slipping off from the bent edge portion 22a. Thus, the attachment of the pressing member 30 to the used tape guide 20 is appropriately maintained.

As shown in FIG. 8, a support section 14b is located behind and close to the bent edge portion 22a of the used tape guide 20 (auxiliary surface portion 22) with a small gap between the support section 14b and the bent edge portion 22a, to support a front end portion of the tape feeder 16. Thus, even if the insertion and removal section 32 is moved obliquely upward along the bent edge portion 22a by vibration or the like, the support section 14b serves as a barrier to prevent the insertion and removal section 32 from slipping off from the bent edge portion 22a. That is, the insertion and removal section 32 is easily removed from the bent edge portion 22a only when the pressing member 30 is artificially pulled upward so as to separate the insertion guide section 32c from the fixed portion 32a.

With the pressing member 30 attached to the used tape guide 20 (with the insertion and removal section 32 installed on the bent edge portion 22a), an opening behind the guide gripping section 31 lies opposite the used tape support surface 17c of the tape feeder 16 through the window portion Wa, and an opening in front of the guide gripping section 31 lies opposite the guide surface section 26a of the guide section 26. Moreover, the front side connection section 31d of the guide gripping section 31 is disposed at a position on a forward extension line of the inclined surface of the used tape support surface 17c of the tape feeder 16 installed on the feeder installation section 14.

Furthermore, the pressing section 33 of the pressing member 30 comes into abutting contact with a lower area of the guide section 26 (guide surface section 26a) of the base surface portion 21 and the guide section 27 (guide surface portion 27a) and is thus flexed. A resilient force resulting from the flexure causes the pressing section 33 to be compressed against the lower area of the guide surface section 26a and the guide surface portion 27a. Thus, as shown in FIG. 8, the used tape 15a fed along the used tape support surface 17c is guided into the interior of the guide gripping section 31 through the opening behind the guide gripping section 31, then out through the opening in front of the guide gripping section 31, and then to between the pressing section 33 and the guide surface section 26a. The used tape 15a then moves along the guide surface sections 26a and 27a while being pressed against the guide surface sections 26a and 27a by the pressing section 33.

If the used tape 15a fed along the used tape support surface 17c moves forward without bending downward, the used tape 15a comes into abutting contact with the front side connection section 31d of the guide gripping section 31 and is guided downward. Thus, the used tape 15a is reliably fed to the guide surface sections 26a and 27a. That is, in this example, the guide gripping section 31 corresponds to a guide section of the pressing member according to the present disclosure (the guide section that guides the used tape fed out from the tape feeder toward a position which is on the guide surface and at which the used tape 15a is pressed by the pressing member).

Furthermore, the bent portion 33b of the pressing section 33 is raised above the guide surface portion 27a. Thus, when the tape feeder 16 is removed from the feeder installation section 14, the used tape 15a pulled back on conjunction with the removal is prevented from being caught on the pressing section 33.

The pressing member 30 is not attached to all positions on the used tape guide 20 (bent edge portion 22a) corresponding to the guide sections 26 and 27 but only to needed positions. That is, the pressing member 30 is attached to only positions corresponding to those of the tape feeders 16 installed on the feeder installation section 14 which need the pressing member 30. For example, if the used tape 15a strides over two adjacent guide sections 26 (27), tape feeding is affected when the used tape 15a is pressed against the guide sections 26 and 27. Thus, in this case, the pressing member 30 needs to avoid being attached to portions corresponding to the two adjacent portions 26 (27). Furthermore, if the used tape 15a is very rigid and need not be pressed by the pressing member 30, the pressing member 30 needs to avoid being attached. That is, the pressing member 30 is installed on and removed from the used tape guide 20 (bent edge portion 22a) depending on the type of the used tape 15a or the like.

As described above, the base 11 includes the fall-down hole 28 formed therein and through which the used tape 15a falls down into the collection box disposed below the base 11. The support section 11a of the used tape guide 20 includes a communication hole 28a formed therein and which is in communication with the fall-down hole 28. A lower end portion of the used tape guide 20 is in communication with the communication hole 28a.

The cutter 29 is provided below the used tape guide 20 to cut the used tape 15a into a predetermined length. The cutter 29 includes a fixed blade 29a formed of a lower surface of the support section 11a, a movable blade 29b that moves, below the support section 11a, forward and rearward with respect to the fixed blade 29a, and a drive device (not shown in the drawings) that drives the movable blade 29b. A blade portion of the fixed blade 29a is shaped like a straight line extending in a direction (X direction) orthogonal to a traveling direction of the movable blade 29b. On the other hand, a blade portion of the movable blade 29b is shaped like the character V that is recessed in the center thereof in a planar view. The drive device includes a movable support section 29c to which the movable blade 29b is fixed, an actuator that moves the movable support section 29c, and a shock absorber 29d that mitigates a shock caused when the movable support section 29c stops moving.

While the cutter 29 is inactive, the movable blade 29b is disposed away from the fixed blade 29a as shown in FIG. 8. Thus, the used tape 15a moved along the used tape guide 20 is guided downward through the communication hole 28a and between both the blades 29a and 29b. Then, at a predetermined timing, the cutter 29 is actuated, that is, the movable blade 29b moves toward the fixed blade 29a side, to cut the used tape 15a. In this case, the actuation timing for the cutter 29 is controlled so as to cut the used tape 15a into a length of about 100 mm.

When the electronic packaging apparatus 10 configured as described is used to perform an operation of mounting the electronic component B on the printed circuit board A, a plurality of tape feeders 16 corresponding to the printed circuit board A is mounted on the feeder installation section 14. In this state, the mounting operation is started. In each of the tape feeders 16, the tape 15 is pulled out from the reel and fed through the conveying path to the tape guide section 17. The cover tape 15b is then peeled off by the tape guide 17a. The peeled-off cover tape 15b is fed to the cover tape collection section by the pick-up mechanism 18. The carrier tape 15a moves along the used tape support surface 17c after the electronic component B has been unloaded.

The used tape 15a from which the electronic component B has been unloaded is fed forward from a leading end portion of the used tape support surface 17c and moves obliquely downward through the window portion Wa of the used tape guide 20 toward the guide gripping section 31 of the pressing member 30. A leading end portion of the used tape 15a passes through the guide gripping section 31 and reaches the guide surface section 26a of the guide section 26. Subsequently, the used tape 15a is guided by the protruding portion formation piece 26b and thus moves downward along the guide surface section 26a without being laterally displaced. The used tape 15a further moves and slips under the swing section 33a of the pressing member 30.

Thus, the used tape 15a moves downward while being pressed against the guide surface sections 26a and 27a by the swing section 33a. The used tape 15a is also prevented by the protruding portion formation piece 27b of the guide section 27 from being laterally displaced while moving along the guide surface portion 27a. Thus, when the used tape 15a with a predetermined length passes through the position of the cutter 29, the cutter 29 is actuated to cut the used tape 15a, and the cut used tape 15a is placed in the collection box. At this time, a portion of the used tape 15a located upstream of the cutter 29 is pressed against the guide surface portion 27a by the swing section 33a of the pressing member 30. Thus, the used tape 15a is prevented from vibrating.

For example, without the pressing member 30, possible vibration during cutting may cause the used tape 15a to be rolled up or bent upward to cause a jam in the used tape guide 20. However, when the pressing member 30 presses the used tape 15a to prevent the vibration, a possible jam is prevented.

Although a plurality of the used tapes 15a fed out from the plurality of tape feeders 16 passes simultaneously through the used tape guide 20, each of the used tapes 15a is fed downward by being guided by the guide sections 26 and 27. Thus, the adjacent used tapes 15a move to the position of the cutter 29 without being entangled, and are then cut into predetermined lengths, with the cut used tapes 15a placed in the collection box.

Thus, the jam prevention mechanism according to the present embodiment includes the used tape guide 20 with the guide surface sections 26a and 27a that guide the used tape 15a fed out from the tape feeder 16 to the cutter 29, and the pressing member 30 that presses the used tape 15a guided along the guide surface sections 26a and 27a, against the guide surface sections 26a and 27a. Thus, when cut by the cutter 29, the used tape 15a is prevented from vibrating in the vicinity of the cutting section and thus from being rolled up or bent. This effectively prevents the used tape guide 20 from being jammed with the used tape 15a.

Furthermore, since the pressing member 30 is removably attached to the bent edge portion 22a of the used tape guide 20, the pressing member 30 can be removed when the used tape 15a is of a type that need not be pressed or when attachment of the pressing member 30 may affect conveyance of the used tape 15a. Thus, the embodiment can effectively prevent a possible jam with the used tape 15a and avoid a disadvantageous situation in which the used tape 15a is prevented from being smoothly conveyed depending on the type of the tape used or the like.

In particular, in the jam prevention mechanism, the used tape guide 20 includes the auxiliary surface portion 22 with the opposite surface to the guide surface section 26a and the plate-like bent edge portion 22a provided at the upper end of the auxiliary surface portion 22. On the other hand, the pressing member 30 includes the insertion and removal section 32 having the substantially U-shaped cross section and which pinches the bent edge portion 22a in the direction of the thickness thereof. Then, the pressing member 30 can be supported by the auxiliary surface portion 22 by moving the insertion and removal section 32 closer to the bent edge portion 22a from the upstream side in the guide direction such that the bent edge portion 22a is inserted into the insertion and removal section 32. On the other hand, the pressing member 30 can be removed from the auxiliary surface portion 22 by pulling out the insertion and removal section 32 from the bent edge portion 22a toward the upstream side in the guide direction. Thus, the pressing member 30 can be very easily and quickly attached to and removed from the used tape guide 20.

Furthermore, the pressing member 30 is formed by using a band-like plate spring as a material such that the insertion and removal section 32 is formed of a fold-back portion obtained by folding back one longitudinal end of the plate spring, and the pressing section 33 is formed of the remaining portion of the plate spring. The flexed pressing section 33 when flexed comes into contact with the used tape 15a so that the resilient force resulting from the flexure of the pressing section 33 causes the used tape 15a to be pressed against the guide surface sections 26a and 27a. Thus, the pressing member 30 with a relatively simple structure enables a possible jam with the used tape 15a to be prevented. Furthermore, the pressing member 30 includes the guide gripping section 31 which guides the used tape 15a into the used tape guide 20 and which serves as a gripping section when the pressing member 30 is held by hand. Consequently, the used tape 15a fed out from the tape feeder 16 can be reliably introduced into the used tape guide 20, and the pressing member 30 can be easily attached to and removed from the used tape guide 20. Since the guide gripping section 31 of the pressing member 30 also functions to guide the used tape 15a as described above, the embodiment has another advantage of enabling a reduction in the number of components of the mechanism.

Another embodiment of the jam prevention mechanism according to the present disclosure may be configured such that the pressing section 33 of the pressing member 30 is swingably connected to the insertion and removal section 32 and that the lower end portion of the pressing member 30 presses the guide surface sections 26a and 27a under the weight of the pressing member 30. In this case, the pressing section 33 is preferably formed of a plate member with a predetermined weight instead of the plate spring. This configuration can exert effects similar to the effects of the above-described embodiment.

Yet another embodiment of the jam prevention mechanism according to the present disclosure may be configured such that the used tape 15a is pressed against the guide surface sections 26a and 27a utilizing magnetic attractive force. In this case, the pressing section 33 may be formed of, for example, a thin magnetic metal plate, and a permanent magnet or a magnetism generating solenoid may be provided on a lower portion of a front surface side of the base surface portion 21 to attract the pressing section 33 toward the guide surface sections 26a and 27a. This configuration can also exert effects similar to the effects of the above-described embodiment.

Furthermore, the jam prevention mechanism according to the present disclosure is not intended to be limited to the above-described embodiments, but the embodiments may be changed where appropriate. For example, in the above-described embodiments, the pressing member 30 includes the guide gripping section 31. However, the guide gripping section 31 may be omitted. In this case, an operation of attaching or removing the pressing member 30 is performed with the insertion and removal section 32 held directly by hand. Furthermore, the distance between the pair of side surface portions 31a of the guide gripping section 31 and the width of the pressing section 33 are properly changed according to the width of the tape 15a used. Additionally, other components included in the jam prevention mechanism according to the present disclosure may be properly changed within the technical scope of the present disclosure.

In still another embodiment of the jam prevention mechanism according to the present disclosure, a support member for supporting the pressing member 30 (the support member according to the present disclosure) may be provided which is different from the used tape guide 20. For example, a dedicated support member (which corresponds to the bent edge portion 22a) for supporting the pressing member 30 may be fixed to an upper front wall surface of the support section 14b supporting the front end portion of the tape feeder 16, so as to removably support the pressing member 30.

The above-described embodiments will be summarized as follows.

An aspect of the present disclosure provides a jam prevention mechanism for a used tape fed out from a tape feeder, the mechanism including a used tape guide with a guide surface along which the used tape is guided in a guide direction parallel to a longitudinal direction of the used tape, a pressing member that presses, against the guide surface, the used tape guided along the guide surface, and a support member that removably supports the pressing member.

According to this configuration, the used tape fed out from the tape feeder is pressed against the guide surface by the pressing member, thus preventing the used tape from vibrating to prevent a possible jam with the used tape caused by the vibration. Furthermore, the pressing member is removable from the support member. Thus, for example, for a tape of a type that need not be pressed, pre-removing the pressing member allows avoidance of a disadvantageous situation in which the pressing member prevents the used tape from being smoothly conveyed.

Preferably, the jam prevention mechanism further includes a cutter disposed downstream of and adjacent to the used tape guide in the guide direction to cut the used tape guided along the guide surface, and the pressing member presses the used tape at a position near the cutter.

According to this configuration, when the used tape is cut by the cutter, vibration of the used tape can be prevented which may occur at the position near the cutter. Thus, a possible jam involved in the cutting of the used tape can be effectively prevented.

Preferably, in the jam prevention mechanism, the used tape guide also functions as the support member.

This configuration eliminates the need to provide a dedicated support member for supporting the pressing member, allowing the jam prevention mechanism to be simplified and enabling a reduction in the costs of the jam prevention mechanism.

As a specific configuration for this case, the used tape guide has a based surface portion with the guide surface, and an auxiliary surface portion with an opposite surface to the guide surface, and the pressing member is removably supported by the auxiliary surface portion.

In this configuration, the used tape is guided along the guide surface between the base surface portion and auxiliary surface portion of the used tape guide. The pressing member installed on the auxiliary surface portion presses the used tape against the guide surface. This configuration allows the pressing member to be appropriately disposed at a position on the used tape guide near the guide surface.

Preferably, in the jam prevention mechanism, the support member has a plate-like edge portion facing an upstream side in the guide direction, the pressing member includes an insertion and removal section which pinches the edge portion in a direction of a thickness thereof, and the pressing member is supported by the support member by moving the insertion and removal section closer to the edge portion from the upstream side such that the edge portion is inserted into the insertion and removal section, whereas the pressing member is removed from the support member by pulling out the insertion and removal section from the edge portion toward the upstream side.

According to this configuration, the pressing member can be easily and quickly attached to and removed from the support member simply by inserting/removing the insertion and removal section into/from the edge portion of the support member.

In this case, the edge portion of the support member is preferably shaped to be bent in a middle portion of the edge portion in the guide direction.

According to this configuration, since the edge portion is bent, the insertion and removal section installed on the edge portion has difficulty moving along the edge portion. This effectively prevents the pressing member from being unintentionally slipped off from the support member.

In the jam prevention mechanism, the pressing member includes a band-like main body portion extending in the guide direction, and the insertion and removal section provided at one longitudinal end of the main body portion, and the main body portion presses the used tape guided along the guide surface.

In this configuration, the used tape can be appropriately pressed over a wide area thereof in the longitudinal direction thereof using the main body portion extending in the guide direction. In addition, the pressing member with the longitudinal end thereof pinched can be easily attached to and removed from the support member.

In this case, the pressing member is formed by using a band-like plate spring as a material such that the insertion and removal section thereof is formed of a fold-back portion obtained by folding back one longitudinal end of the plate spring, and the main body portion thereof is formed of the remaining portion of the plate spring. Preferably, the main body portion when flexed comes into contact with the used tape so as to press the used tape using a resilient force resulting from the flexure of the main body portion.

This configuration is simple and enables the used tape to be appropriately pressed against the guide surface using the resilient force of the plate spring (main body portion).

In another example, the used tape guide may include the guide surface inclined with respect to a vertical direction, the main body portion of the pressing member may be swingably connected to the insertion and removal section, and the main body portion may press the used tape guided along the guide surface under a weight of the main body portion.

This configuration is simple and enables the used tape to be appropriately pressed against the guide surface utilizing the weight of the main body portion.

In the jam prevention mechanism, the pressing member preferably includes a guide section that guides the used tape fed out from the tape feeder toward a position which is on the guide surface and at which the used tape is pressed by the pressing member.

This configuration enables the used tape fed out from the tape feeder onto the guide surface to be appropriately guided onto the guide surface and then pressed by the pressing member without the need for a dedicated member for guiding the used tape onto the guide surface.

Although the present disclosure has been fully described by way of example with reference to the accompanying drawings, it is to be understood that various changes and modifications will be apparent to those skilled in the art. Therefore, unless otherwise such changes and modifications depart from the scope of the present disclosure hereinafter defined, they should be construed as being included therein.

What is claimed is:

1. A jam prevention mechanism for use in an electronic packaging apparatus to prevent a jam of a used tape fed out from a tape feeder, the jam prevention mechanism comprising:
a feeder installation section in which the tape feeder is installed;
a used tape guide that is arranged to face the feeder installation section and guides the used tape fed out from the tape feeder; and
a pressing member that presses the used tape guided by the used tape guide, wherein
the used tape guide includes a guide surface along which the used tape is guided in a guide direction following a longitudinal direction of the used tape and a support member spaced apart from the guide surface such that the used tape passes between the guide surface and the support member, the guide direction having an upstream side and a downstream side corresponding to the longitudinal direction of the used tape,
the pressing member presses the used tape against the guide surface, the pressing member being disposed between the guide surface and the support member such that the pressing member is supported by the support member, wherein
the support member includes an auxiliary surface portion that has a plate-shaped edge portion extending toward the upstream side in the guide direction,
the pressing member includes an insertion and removal section removably installed on the edge portion of the auxiliary surface portion, and a main body portion extending from the insertion and removal section toward the downstream side in the guide direction, the main body portion being a pressing section that presses the used tape against the guide surface, and
the insertion and removal section includes an elastic rounded bent portion and a straight portion, the elastic rounded bent portion having a substantially U-shaped cross-section that partially surrounds the edge portion of the auxiliary surface portion, the straight portion extending between the elastic rounded bent portion and the pressing section, and the edge portion of the auxiliary surface portion is pinched between a leading edge of the elastic bent portion and a surface of the straight portion by a resilient force of the bent portion.

2. The jam prevention mechanism according to claim 1, further comprising a cutter disposed downstream of and adjacent to the used tape guide in the guide direction to cut the used tape guided along the guide surface,
wherein the pressing member presses the used tape at a position near the cutter.

3. The jam prevention mechanism according to claim 1, wherein the used tape guide includes a base portion with the guide surface, and the auxiliary surface portion has an opposite surface to the guide surface, and
the pressing member is removably supported by the auxiliary surface portion.

4. The jam prevention mechanism according to claim 1, wherein the edge portion of the auxiliary surface portion is shaped to be bent in a middle portion of the edge portion in the guide direction.

5. The jam prevention mechanism according to claim 1, wherein the pressing member is configured by a long plate spring such that a longitudinal end of the plate spring forms the rounded bent portion of the insertion and removal section, and a remaining portion of the plate spring is the main body portion.

6. The jam prevention mechanism according to claim 1, wherein the used tape guide includes the guide surface inclined with respect to a vertical direction, and
the main body portion of the pressing member is connected to the insertion and removal section, and the main body portion presses the used tape guided along the guide surface.

7. The jam prevention mechanism according to claim 1, wherein
the guide section is fixedly attached to a surface on one side of the straight portion that is opposite to where the rounded bent portion is located.

8. The jam prevention mechanism according to claim 1, further comprising:
another one or more tape feeders lying in parallel with the tape feeder in the feeder installation section, wherein
the guide surface of the used tape is composed of a plurality of guide surface sections arranged in parallel with each other to each guide the used tape fed out from each of the tape feeders, and
the support member of the used tape guide supports another one or more pressing members each pressing the used tape fed out from each of the tape feeders against the corresponding guide surface section, in addition to the pressing member.

9. The jam prevention mechanism according to claim 8, wherein
the used tape guide has a window portion that allows the used tape fed out from each of the tape feeders to pass therethrough, and guides the used tape passing through the window portion.

10. A jam prevention mechanism for use in an electronic packaging apparatus to prevent a jam of a used tape fed out from a tape feeder, the jam prevention mechanism comprising:

a feeder installation section in which the tape feeder is installed;

a used tape guide that is arranged to face the feeder installation section and guides the used tape fed out from the tape feeder; and a pressing member that presses the used tape guided by the used tape guide, wherein the used tape guide includes a guide surface along which the used tape is guided in a guide direction following a longitudinal direction of the used tape and a support member spaced apart from the guide surface such that the used tape passes between the guide surface and the support member, the guide direction having an upstream side and a downstream side corresponding to the longitudinal direction of the used tape, the pressing member presses the used tape against the guide surface, the pressing member being disposed between the guide surface and the support member such that the pressing member is supported by the support member, the support member includes an auxiliary surface portion that has a plate-shaped edge portion extending toward the upstream side in the guide direction, the pressing member has a long plate-shaped main body portion extending in the guide direction, and an insertion and removal section provided on a longitudinal end of the main body portion and attached to the edge portion of the auxiliary surface portion in such a manner as to be removable toward the upstream side in the guide direction, the insertion and removal section includes an elastic rounded bent portion and a straight portion, the elastic rounded bent portion having a substantially U-shaped cross-section that partially surrounds the edge portion of the auxiliary surface portion, the straight portion extending between the elastic rounded bent portion and the pressing section, and the edge of the auxillary surface portion is pinched between a leading edge of the elastic bent portion and a surface of the straight portion by a resilient force of the bent portion, and the pressing member is configured by a long plate spring such that a longitudinal end of the plate spring forms the insertion and removal section, and the main body portion is formed of a remaining portion of the plate spring, and the main body portion presses the used tape against the guide surface.

11. A jam prevention mechanism for use in an electronic packaging apparatus to prevent a jam of a used tape fed out from a tape feeder, the jam prevention mechanism comprising:

a feeder installation section in which the tape feeder is installed;

a used tape guide that is arranged to face the feeder installation section and guides the used tape fed out from the tape feeder; and a pressing member that presses the used tape guided by the used tape guide, wherein the used tape guide includes a guide surface along which the used tape is guided in a guide direction following a longitudinal direction of the used tape and a support member spaced apart from the guide surface such that the used tape passes between the guide surface and the support member, the guide direction having an upstream side and a downstream side corresponding to the longitudinal direction of the used tape, the pressing member presses the used tape against the guide surface, the pressing member being disposed between the guide surface and the support member such that the pressing member is supported by the support member, the guide surface of the used tape guide is inclined with respect to a vertical direction, the pressing member has a long plate-shaped main body portion extending in the guide direction, and an insertion and removal section provided on a longitudinal end of the main body portion and attached to an edge portion of the support member in such a manner as to be removable toward the upstream side in the guide direction, the insertion and removal section includes an elastic rounded bent portion and a straight portion; the elastic rounded bent portion having a substantially U-shaped cross-section that partially surrounds the edge portion of the auxiliary surface portion, the straight portion extending between the elastic rounded bent portion and the pressing section, and the edge of the auxiliary surface portion is pinched between a leading edge of the elastic bent portion and a surface of the straight portion by a resilient force of the bent portion, and the main body portion is connected to the insertion and removal section, and presses the used tape guided along the guide surface under a weight of the main body portion.

* * * * *